(12) United States Patent
Stein

(10) Patent No.: US 6,175,590 B1
(45) Date of Patent: *Jan. 16, 2001

(54) METHOD AND APPARATUS FOR DETERMINING THE RATE OF RECEIVED DATA IN A VARIABLE RATE COMMUNICATION SYSTEM

(75) Inventor: Jeremy M. Stein, Tel-Aviv (IL)

(73) Assignee: Qualcomm Inc., San Diego, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/908,866
(22) Filed: Aug. 8, 1997
(51) Int. Cl.$^7$ .................................................. H04B 17/00
(52) U.S. Cl. ........................ 375/225; 375/341; 375/343; 714/404; 714/799; 370/252
(58) Field of Search ..................................... 375/225, 341, 375/343; 714/704, 795–799; 370/252

(56) References Cited

U.S. PATENT DOCUMENTS 5,230,003  7/1993  Dent et al. .............................. 371/43

FOREIGN PATENT DOCUMENTS 0763902  3/1997  (EP) .
9501032  1/1995  (WO) .
9522818  8/1995  (WO) .

*Primary Examiner*—Amanda T. Le
(74) *Attorney, Agent, or Firm*—Philip Wadsworth; Thomas R. Rouse; Pavel Kalousek

(57) ABSTRACT

A method and apparatus for determining the rate of received data in a variable rate communication system. The receiving system decodes each frame of the received signal to produce a set of normalized correlation metrics, cyclic redundancy check (CRC) bits, and possibly Yamamoto quality metrics, one for each possible data rate. The normalized correlation metric for each rate is calculated from a correlation value an a constant computed for that rate. The correlation value is determined from a correlation of the demodulated soft frame symbols and the re-encoded frame. The highest normalized correlation metric is selected and the CRC bit for this data rate is checked. If the CRC checks, this data rate is indicated as the received data rate. Otherwise, the next highest normalized correlation metric is selected and the process continues. If no CRC check, an erasure is indicated.

41 Claims, 2 Drawing Sheets

METHOD AND APPARATUS FOR DETERMINING THE RATE OF RECEIVED DATA IN A VARIABLE RATE COMMUNICATION SYSTEM

BACKGROUND OF THE INVENTION

I. Field of the Invention

The present invention relates to communications. More particularly, the present invention relates to a method and apparatus for determining data rate in a variable rate communication system.

II. Description of the Related Art

The use of code division multiple access (CDMA) modulation techniques is one of several techniques for facilitating communications in which a large number of system users are present. Although other techniques such as time division multiple access (TDMA), frequency division multiple access (FDMA), and AM modulation schemes such as amplitude companded single sideband (ACSSB) are known, CDMA has significant advantages over these other techniques. The use of CDMA techniques in a multiple access communication system is disclosed in U.S. Pat. No. 4,901,307, entitled "SPREAD SPECTRUM MULTIPLE ACCESS COMMUNICATION SYSTEM USING SATELLITE OR TERRESTRIAL REPEATERS," and assigned to the assignee of the present invention and incorporated by reference herein. The use of CDMA techniques in a multiple access communication system is further disclosed in U.S. Pat. No. 5,103,459, entitled "SYSTEM AND METHOD FOR GENERATING SIGNAL WAVEFORMS IN A CDMA CELLULAR TELEPHONE SYSTEM", assigned to the assignee of the present invention and incorporated by reference herein.

CDMA by its inherent nature of being a wideband signal offers a form of frequency diversity by spreading the signal energy over a wide bandwidth. Therefore, frequency selective fading affects only a small part of the CDMA signal bandwidth. Space or path diversity is obtained by providing multiple signal paths through simultaneous links from a mobile user through two or more cell-sites. Furthermore, path diversity may be obtained by exploiting the multipath environment through spread spectrum processing by allowing a signal arriving with different propagation delays to be received and processed separately. Examples of path diversity are illustrated in U.S. Pat. No. 5,101,501 entitled "METHOD AND SYSTEM FOR PROVIDING A SOFT HANDOFF IN COMMUNICATIONS IN A CDMA CELLULAR TELEPHONE SYSTEM", and U.S. Pat. No. 5,109,390 entitled "DIVERSITY RECEIVER IN A CDMA CELLULAR TELEPHONE SYSTEM", both assigned to the assignee of the present invention, and incorporated by reference herein.

CDMA systems often employ a variable rate vocoder to encode data so that the data rate can be varied from one data frame to another. An exemplary embodiment of a variable rate vocoder is described in U.S. Pat. No. 5,414,796, entitled "VARIABLE RATE VOCODER," assigned to the assignee of the present invention and incorporated by reference herein. The use of a variable rate communications channel reduces mutual interference by minimizing unnecessary transmissions when there is no useful speech to be transmitted. Algorithms are utilized within the vocoder for generating a varying number of information bits in each frame in accordance with variations in speech activity. For example, a vocoder with a rate set of four may produce 20 millisecond data frames containing 20, 40, 80, or 160 bits, depending on the activity of the speaker. It is desired to transmit each data frame in a fixed amount of time by varying the transmission rate of communications. Additional details on the formatting of the vocoder data into data frames are described in U.S. Pat. No. 5,511,073, entitled "METHOD AND APPARATUS FOR THE FORMATTING OF DATA FOR TRANSMISSION," assigned to the assignee of the present invention, and incorporated by reference herein.

One technique for the receiver to determine the data rate of a received data frame is described in copending U.S. Pat. No. 5,566,206 entitled "METHOD AND APPARATUS FOR DETERMINING DATA RATE OF TRANSMITTED VARIABLE RATE DATA IN A COMMUNICATIONS RECEIVER," filed Apr. 26, 1994, now U.S. Pat. No. 5,566,206, issued Oct. 15, 1996 assigned to the assignee of the present invention and incorporated by reference herein. Another technique is described in copending U.S. Pat. No. 5,710,784 entitled "MULTIRATE SERIAL VITERBI DECODER FOR CODE DIVISION MULTIPLE ACCESS SYSTEM APPLICATIONS," issued Jan. 20,1998 now abandoned, assigned to the assignee of the present invention, and incorporated by reference herein. Yet another technique is described in U.S. Pat. No. 5,751,725 entitled "METHOD AND APPARATUS FOR DETERMINING THE RATE DATA IN A VARIABLE RATE COMMUNICATION SYSTEM", issued May 12, 1998 now U.S. Pat. No. 5,751,725, assigned to the assignee of the present invention and incorporated by reference herein. According to these techniques, each received data frame is decoded at each of the possible rates. Error metrics, which describe the quality of the decoded symbols for each frame decoded at each rate, are provided to a processor. The error metrics may include cyclic redundancy check (CRC) results, Yamamoto quality metrics, and symbol error rates. These error metrics are well-known in communications systems. The processor analyzes the error metrics and determines the most probable rate at which the incoming symbols were transmitted.

SUMMARY OF THE INVENTION

The present invention provides a novel and improved method and apparatus for determining the data rate of received data in a variable rate communication system. The present invention is employed in a communications system having a transmission system and a receiving system, where the receiving system determines at which of a plurality of data rates individual frames in a signal has been transmitted by the transmission system. For example, if the transmission system employs four data rates, the receiving system decodes each frame of the received signal based on the four rates to produce four normalized correlation metrics, four cyclic redundancy check (CRC) bits, and zero or more Yamamoto quality metrics. In the present invention, the highest normalized correlation metric is first selected and the CRC bit for this data rate is checked. If the CRC checks, this data rate is indicated as the received data rate. Otherwise, the next highest normalized correlation metric is selected and the process continues. If no CRC check, an erasure is indicated.

In the typical situation, only the data rate corresponding to the highest normalized correlation metric is considered. This frame can be accepted or erased, depending on the CRC check and/or the Yamamoto quality metric. In some applications, CRC encoding may not be performed on all data rates. When this occurs, the Yamamoto quality metric can be used in place of the CRC check, other metrics can be used, or the data rate determination process can be made dependent only on the normalized correlation metrics.

It is an object of the present invention to provide a reliable determination of the received data rate. In the present invention, a normalized correlation metric is calculated for each possible data rate from a correlation value and a correlation constant which have been calculated for that data rate. The correlation value is determined from a correlation of the demodulated soft frame symbols and the re-encoded frame. The use of soft symbols enhances the quality of the normalized correlation metrics over other metrics of the prior art, such as the symbol error rate (SER) which only utilizes the sign bits of the demodulated soft frame symbols. The correlation constants can be calculated using theoretical values, simulated, or measured empirically to provided robust performance. In addition, the use of normalized correlation metrics works well over a wide range of input energy-per-bit-to-total-noise ratio $E_b/N_t$.

It is another object of the present invention to minimize erroneous data rate indication which results in frame error. In some communication systems, such as the CDMA communication system, a frame error is more catastrophic than an erasure. Thus, the present invention can be optimized to minimize the frame error rate, at the expense of slightly higher erasure rate, by comparing the normalized correlation metrics against a correlation threshold. Normalized correlation metrics which fall below the threshold are discarded. In addition, the difference between the two highest normalized correlation metrics can be determined and compared against a difference threshold. If the difference is below the threshold, both normalized correlation metrics can be discarded.

It is yet another object of the present invention to improve the data rate determination process by utilizing the Yamamoto quality metrics. The Yamamoto quality metrics for each decoded data rate can be determined during the decoding process. After the highest normalized correlation metric has been selected and the CRC checked, the Yamamoto quality metric for this data rate can be compared against a Yamamoto threshold. If the Yamamoto quality metric falls below the threshold, this data rate can be discarded.

BRIEF DESCRIPTION OF THE DRAWINGS

The features, objects, and advantages of the present invention will become more apparent from the detailed description set forth below when taken in conjunon with the drawings in which like reference characters identify correondingly throughout and wherein.

DETAILED DESCRIPTION OF THE PREFERRED EMBODIMENTS

Figure 1:
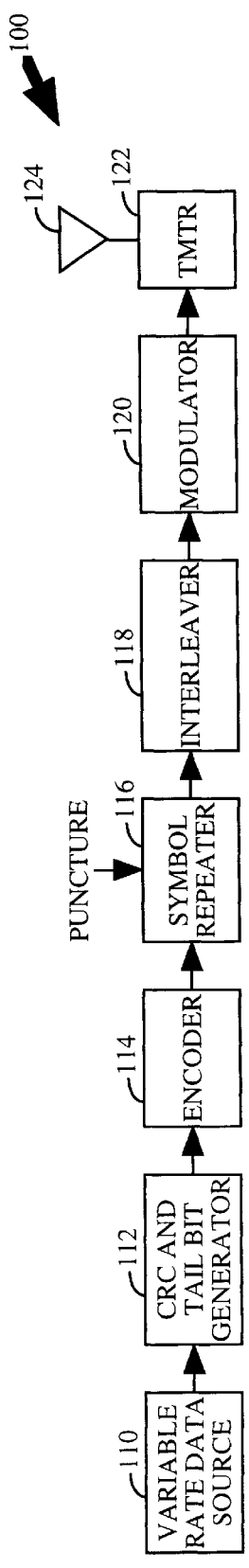
FIG. 1 is an exemplary block diagram of the transmission system of the present invention.
Figure 2:
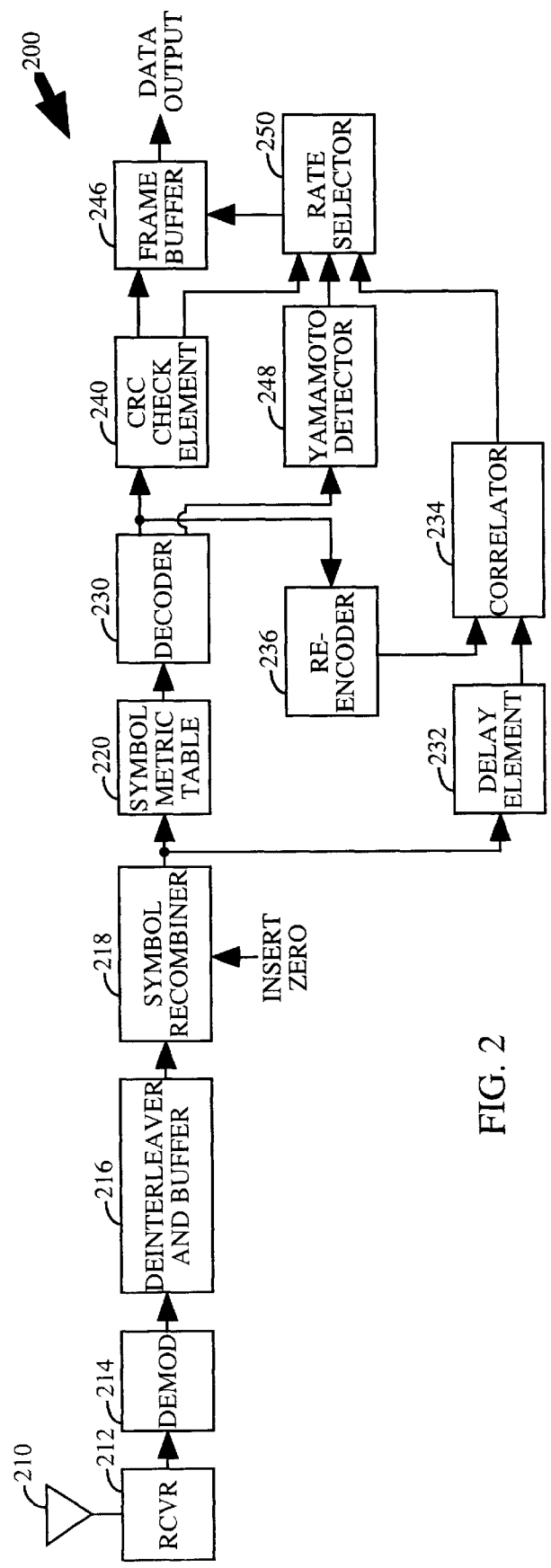
FIG. 2 is an exemplary block diagram of the receiving system of the present invention.

Referring to FIGS. 1–2, transmission system 100 transmits data to receiving system 200. In an exemplary embodiment, the present invention is implemented in a wireless communication system which communicates using spread spectrum modulation signals. Communication using spread spectrum communication systems is described in detail in the aforementioned U.S. Pat. Nos. 4,901,307 and 5,103,459.

An exemplary block diagram of the transmission system 100 of the present invention is shown in FIG. 1. Variable rate data source 110 provides data frames at variable rates to cyclic redundancy check (CRC) and tail bit generator 112. In the exemplary embodiment, data source 110 is a variable rate vocoder for encoding speech information at four variable rates as described in detail in the aforementioned U.S. Pat. No. 5,414,796. The four data rates includes the full, one-half, one-quarter, and one-eight rates which are also referred to as the full, half, quarter, and eighth rates, respectively. When used, for example, in a cellular telephone environment, the signal is transmitted at the full rate to transmit speech (e.g. when a user is talking) and at the eighth rate to transmit silence (e.g. when the user is not talking). The eighth rate saves on the number of bits transmitted, and thereby saves on power. In the exemplary embodiment, 90% of the signals transmitted by transmission system 100 to receiving system 200 are either at the full or eighth rate. The half and quarter rates represent transitional rates between the full and eighth rates.

Generator 112 generates a set of CRC parity bits to provide for error detection at receiving system 200 is well known in the art. In addition, generator 112 appends a sequence of tail bits to the CRC encoded frame. In the exemplary embodiment, generator 112 generates the set of CRC and tail bits in accordance with the Telecommunications Industry Association's "TIA/EIA/IS-95 Mobile Stations-Base Station Compatibility Standard for Dual-Mode Wideband Spread Spectrum Cellular System", hereinafter the IS-95 standard. Generator 112 provides the encoded data frame to encoder 114 which encodes the data into code symbols for error correction and detection at receiving system 200. In the exemplary embodiment, encoder 114 is a rate ½ convolutional encoder as defined in the IS-95 standard for the forward link.

The code symbols from encoder 114 are provided to symbol repeater 116 which repeats each symbol $R_{rx}$ number of times, where $R_{rx}=1$ for full rate, $R_{rx}=2$ for half rate, $R_{rx}=4$ for quarter rate, and $R_{rx}=8$ for eighth rate. Symbol repetition results in a fixed-size data frame (e.g. same number of symbols per frame) at the output of symbol repeater 116 regardless of the symbol rate at the input into symbol repeater 116. Symbol repeater 116 can also include a symbol puncturing mechanism which can puncture the symbols to obtain other code rates, such as rate ¾ for full rate $R_{rx}=1$.

The symbols from symbol repeater 116 are provided to interleaver 118 which reorders the symbols in accordance with a predetermined interleaving format. In the exemplary embodiment, interleaver 118 is a block interleaver, the design and implementation of which is well known in the art. The reordered frame is then provided to modulator 120 which modulates the frame for transmission. In the exemplary embodiment, modulator 120 is a CDMA modulator, the implementation of which is described in detail in the aforementioned U.S. Pat. Nos. 4,901,307 and 5,103,459. The modulated data frame is provided to transmitter (TMTR) 122 which upconverts, filters, and amplifies the signal for transmission through antenna 124.

Within receiving system 200, the transmitted signal is received by antenna 210 and provided to receiver (RCVR) 212 which filters, amplifies, and downconverts the received signal. The signal is then provided to demodulator (DEMOD) 214 which demodulates the signal. In the exemplary embodiment, demodulator 214 is a CDMA demodulator, the implementation of which is described in detail in the aforementioned U.S. Pat. Nos. 4,901,307 and 5,103,459. Demodulator 214 also quantizes the signal into soft decision bits which represent the estimate of the transmitted symbols. In the exemplary embodiment, four soft decision bits are used to represent each received symbol.

The received symbols are provided to de-interleaver and buffer 216. Buffer 216 re-orders the symbols in the frame in accordance with a predetermined re-ordering format as is well known in the art. In the exemplary embodiment, buffer 216 re-orders the symbols in the inverse order that was performed by interleaver 118. The re-ordered symbols are provided to symbol recombiner 218 which combines $R_{rx}$ symbols, where $R_{rx}$ denotes the rate hypothesis being decoded by receiving system 200. In the exemplary embodiment, $R_{rx}=1$ for full rate, $R_{rx}=2$ for half rate, $R_{rx}=4$ for quarter rate, and $R_{rx}=8$ for eighth rate. Symbol recombiner 218 combines the energy of the code symbols which are transmitted over multiple symbols times to provide better estimates of the transmitted symbols. In the exemplary embodiment, the demodulated soft frame symbols from symbol recombiner 218 comprises 4-bit symbols for full rate, 5-bit symbols for half rate, 6-bit symbols for quarter rate, and 7-bit symbols for eight rate. In the embodiment wherein symbol repeater 116 comprises a symbol puncturing mechanism, symbols recombiner 218 comprises a symbol insertion mechanism to replace the punctured symbols with zeros.

In the exemplary embodiment, the demodulated soft frame symbols from symbol recombiner 218 are provided to symbol metric table 220 which converts symbols of varying number of bits into symbols of fixed number of bits. In the exemplary embodiment, the output from symbol metric table 220 comprises 4-bit symbols, although different number of bits can be utilized and are within the scope of the present invention. A fixed number of bits for the soft decision symbols into decoder 230 simplifies the design of decoder 230. In the alternative embodiment, symbol metric table 220 can be eliminated and decoder 230 can be designed to decode symbols having different number of soft decision bits for each data rate (e.g. decoding using all bits provided by symbol recombiner 218).

In the exemplary embodiment, decoder 230 is a multi-rate Viterbi decoder as described in detail in the aforementioned copending U.S. Pat. No. 5,710,784, now abandoned. Decoder 230 provides error correction on the frame of symbols using a predetermined set of rate hypotheses. In the exemplary embodiment, decoder 230 decodes the symbols for each of the four possible rates to provide four separately decoded frames of data, each of which is provided to CRC check element 240. CRC check element 240 determines under conventional techniques whether the CRC parity bits for each frame are correct for the decoded data. CRC check element 240 performs a CRC check of the CRC parity bits in the four decoded frames to help determine whether the currently received frame was transmitted at the full, half, quarter or eighth rate. CRC check element 240 provides four CRC bits $C_0$, $C_1$, $C_2$, and $C_3$ for the full, half, quarter, and eighth rates, respectively. In the exemplary embodiment, a binary value of "1" for a given CRC bit indicates that the CRC bits matched or checked, while a binary value of "0" indicates that the CRC bits did not check.

The decoded frames from decoder 230 are also provided to re-encoder 236 which re-encodes the data. In the exemplary embodiment, re-encoder 236 performs the same function as encoder 114 within transmission system 100. The re-encoded frames $\hat{x}_i$ from re-encoder 236 comprise sequences of binary bits (which can represent "1" and "0" or "1" and "−1") where the subscript i denotes the data rate being decoded. In the exemplary embodiment, the demodulated soft frame symbols from symbol recombiner 218 are also provided to delay element 232 which provides the same amounts of delay as that experienced by symbol metric table 220, decoder 230, and re-encoder 236. The delayed frames from delay element 232 and the re-encoded frames from re-encoder 236 are provided to correlator 234. For each rate, correlator 234 performs a correlation of the two frames which can be described mathematically as $$\text{corr}(\hat{x}_i, y_i) = \sum_{j=1}^{N/R_i} (\hat{x}_{i,j} \cdot y_{i,j}), \tag{1}$$

where $\hat{x}_i$ is the re-encoded frame from re-encoder 236, $y_i$ is the delayed frame from delay element 232, N is the number of symbols within a demodulated frame, $R_i$ is the data rate being decoded, and $\text{corr}(\hat{x}_i, y_i)$ is the correlation between the re-encoded frame and the delayed frame. For each symbol in the frame, correlator 234 multiplies the re-encoded symbol with the demodulated and delayed soft frame symbol and accumulates the resultant product. Specifically, the magnitude of the delayed soft frame symbol is added to the correlation sum for soft frame symbol value with a sign corresponding to that of the re-encoded symbol and subtracted from the correlation sum if the sign differs from that of the re-encoded symbol. If the re-encoded frame is the same as the demodulated soft frame, indicating that no error exist in the received data frame, $\text{corr}(\hat{x}_i, y_i)$ is a high value. However, if the re-encoded frame is uncorrelated with the demodulated soft frame (e.g. maybe due to an incorrect rate hypothesis) $\text{corr}(\hat{x}_i, y_i)$ is a low value. Correlator 234 generates four correlation values: $\text{corr}(\hat{x}_0, y_0)$, $\text{corr}(\hat{x}_1, y_1)$, $\text{corr}(\hat{x}_2, y_2)$, and $\text{corr}(\hat{x}_3, y_3)$ for the full, half, quarter, and eighth rates, respectively, for each received data frame. The CRC bits from CRC check element 240 and the correlation values from correlator 234 are provided to rate selector 250. Rate selector 250 determines which of the four rates the currently received frame was sent.

CRC check element 240 provides four decoded frames to frame buffer 246 for storage, where each of the four frames is decoded under a different rate hypothesis. Based on the rate determined by rate selector 250, a control signal is provided to frame buffer 246 which, in response thereto, outputs the frame decoded at the determined rate or outputs no frame if an erasure is declared. In an alternative embodiment, frame buffer 246 outputs a signal indicative of a frame erasure if an erasure is declared. While decoder 230, delay element 232, correlator 234, re-encoder 236, and rate selector 250 are shown as separate elements, the these elements can be incorporated together to form a single multi-rate decoder.

Under the communication system of FIGS. 1–2, the signal transmitted by transmission system 100 to receiving system 200 can rapidly change between the plurality of rates. In the exemplary embodiment, transmission system 100 does not include within the transmitted signal an actual indication as to the rate at which the signal is currently being transmitted. Such an indication would require additional overhead bits which can be used to transmit information. Transmission system 100 transmits a frame at a current rate which, in the exemplary CDMA communication system, can be one of four possible rates. Rate selector 250 has the task of determining which of the four rates the currently received frame was sent (e.g. whether the current frame was sent at the full, half, quarter or eighth rate) or whether an erasure should be declared (e.g. rate selector 250 can not determined which of the four rates the current frame was sent). Frame buffer 246 then outputs the correct data frame out of the four decoded frames. The decoded data frame can be processed into an appropriately decoded signal which can then be provided to, for example, a vocoder, an amplifier or a speaker (not shown in FIG. 2).

Figure 3:
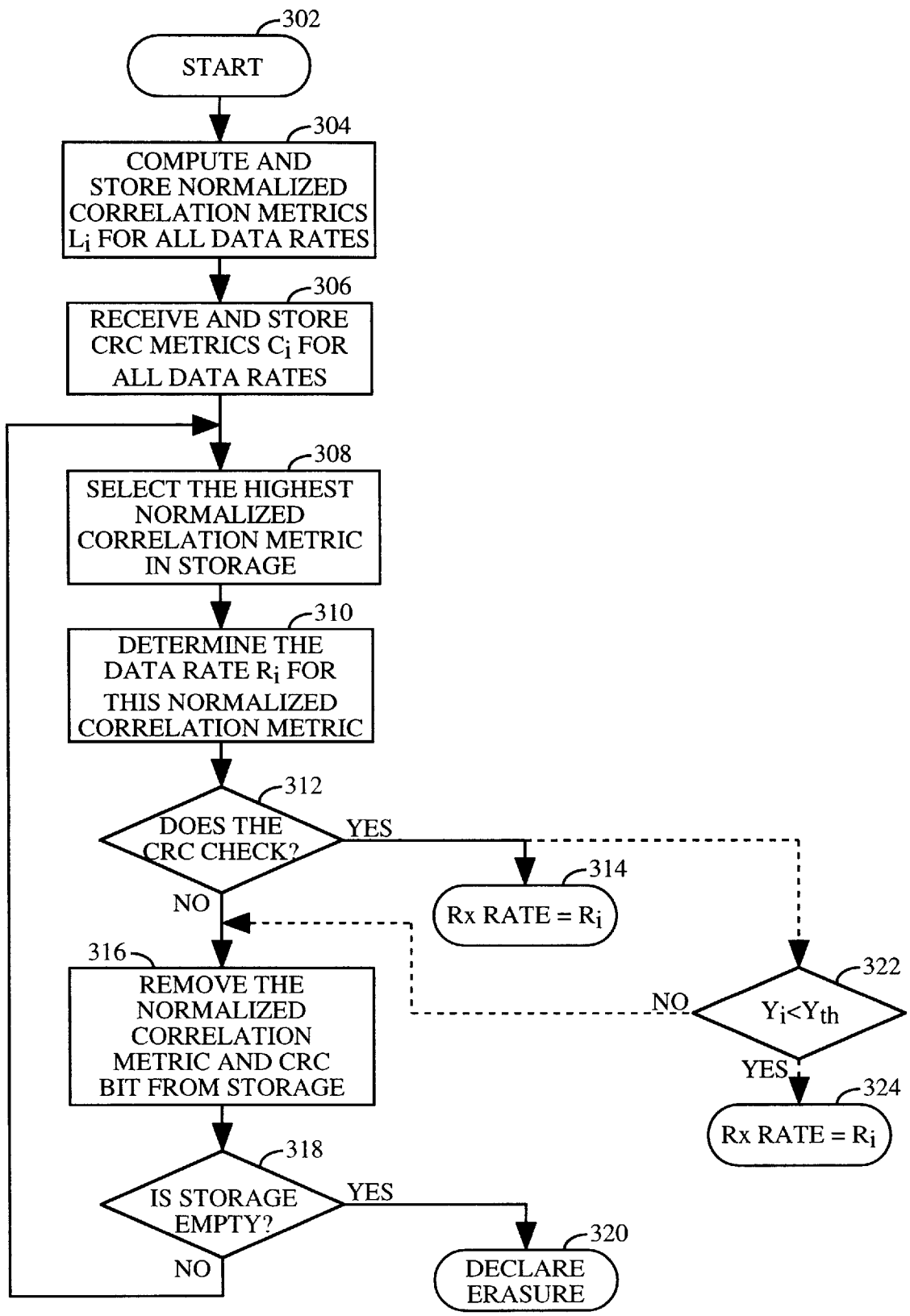
FIG. 3 is an exemplary flow diagram of the data rate determination process of the present invention.

In the exemplary embodiment, rate selector 250 operates in the manner illustrated by the flow diagram of FIG. 3 to select the appropriate decoded frame to be output or provided to the user, or to declare the current frame an erasure condition. Rate selector 250 computes the normalized correlation metric for each decoded data rate. The normalized correlation metric can be calculated using one of many embodiments, four of which are described below. The normalized correlation metric are denoted as $L_m(\hat{x}_i, y)$ where the subscript m represents the embodiment used in the calculation. Other embodiments to calculate the normalized correlation metric can be contemplated and are within the scope of the present invention. The normalized correlation metric calculated using various embodiments, such as those described below, are generically denoted throughout the specification as $L(\hat{x}_i, y)$.

In the first embodiment, the normalized correlation metric $(\hat{x}_i, y)$ is calculated according to the following equation:

$$L_1(\hat{x}_i, y_i) = \text{corr}(\hat{x}_i, y_i) - \text{const}(R_i), \quad (2)$$

where $\text{const}(R_i)$ is a constant which is dependent on the data rate being decoded and the assumed energy of the received signal and $\text{corr}(\hat{x}_i, y_i)$ is the calculation value calculated from equation 1. The calculation of $\text{const}(R_i)$ is given in detail below.

In the second embodiment, if there is no symbol compression (e.g. no symbol metric table 220), the normalized correlation metric $L_2(\hat{x}_i, y)$ can be calculated in according to the following equation:

$$L_2(\hat{x}_i, y_i) = \sum_{j=1}^{N/R_i} |y_{i,j}| - 2 \sum_{j:\text{sgn}(y_{i,j}) \neq \hat{x}_{i,j}}^{N/R_i} |y_{i,j}| - \text{const}(R_i), \quad (3)$$

where $$\sum_{j=1}^{N/R_i} |y_{i,j}|$$

represents the sum of the received symbols (which is related to the energy of the received data frame) and is approximately constant for all received frames at a given data rate $$\sum_{j:\text{sgn}(y_{i,j}) \neq \hat{x}_{i,j}}^{N/R_i} |y_{i,j}|$$

represents the soft symbol error rate (SER), and $\text{const}(R_i)$ is a constant which is dependent on the data rate being decoded and the assumed energy of the received signal, as used in equation 2. The soft SER is the sum of the soft symbol errors within the frame and can be calculated as the total normalized metric of the most likely path. In the exemplary embodiment, the soft SER can be computed from the Viterbi decoding process. During the Viterbi decoding process, at each stage of the trellis, the state metrics are normalized according to the best state metric. The soft SER can be computed by summing the normalization performed on the state metrics throughout the trellis and the final metric in the trellis.

In third embodiment, if there is symbol compression before the decoding process (e.g. symbol metric table 220 is present), the soft SER can be scaled by a scaling factor to account for the compression. The normalized correlation metric $L_3(\hat{x}_i, y)$ can be calculated using the following equation:

$$L_3(\hat{x}_i, y_i) = \sum_{j=1}^{N/R_i} |y_{i,j}| - 2\alpha_i \sum_{j:\text{sgn}(y_{i,j}) \neq x_{i,j}}^{N/R_i} |y_{i,j}| - \text{const}_3(R_i), \quad (4)$$

where $\alpha_i$ is the scaling constant for rate $R_i$ which accounts for the compression by symbol metric table 220. The constant $\text{const}_3(R_i)$ in equation 4 may be modified from const $(R_i)$ in equations 2 and 3 to account for compression by symbol metric table 220.

In the fourth embodiment, the normalized correlation metric $L_4(\hat{x}_i, y)$ can be approximated as:

$$L_4(\hat{x}_i, y_i) = - \sum_{j:\text{sgn}(y_{i,j}) \neq x_{i,j}}^{N/R_i} |y_{i,j}|. \quad (5)$$

This is a good estimation since $$\sum_{j=1}^{N/R_i} |y_{i,j}|$$

is approximately constant for all received data frames for a given data rate, as described above, and is partially offset by the constant $\text{const}(R_i)$. Again, the scaling constant $\alpha_i$ can be used to compensate for the symbol compression by symbol metric table 220.

A flow diagram of the exemplary embodiment of the data rate determination process of the present invention is illustrated in FIG. 3. The rate determination process starts at state 302. In the first step, at block 304, rate selector 250 computes and stores the normalized correlation metrics: $L(\hat{x}_0, y_0)$, $L(\hat{x}_1, y_1)$, $L(\hat{x}_2, y_2)$, $L(\hat{x}_3, y_3)$, and so on, for all rate hypothesis being considered. In the exemplary CDMA communication system, four normalized correlation metrics are calculated for the four data rates. The normalized correlation metrics can be calculated in accordance with equations 2, 3, 4, or 5. At block 306, rate selector 250 receives and stores the four CRC bits $C_0$, $C_1$, $C_2$, and $C_3$ for the four rate hypothesis from CRC check element 240. In the exemplary embodiment, rate selector 250 then determines the data rate of the received signal using the four CRC bits and the four normalized correlation metrics.

At block 308, rate selector 250 selects the highest normalized correlation metric in storage and, at block 310, determines the rate $R_i$ corresponding to this normalized correlation metric. At block 312, rate selector 250 determines whether the CRC checks for this rate hypothesis. If the CRC check passes (e.g. CRC bit="1"), rate selector 250 outputs an indication that $R_i$ is the received data rate, at block 314. If the CRC check fails, rate selector 250 removes the normalized correlation metric and the CRC bits for this rate hypothesis (e.g. invalidate this rate hypothesis), at block 316. At block 318, rate selector 318 then determines whether all four rate hypothesis have been processed (e.g. is the storage empty?). If all four rate hypothesis have been processed, rate selector 250 outputs an erasure indication, at block 320. Otherwise, rate selector 250 returns to block 308 and processes the next highest normalized correlation metric. The process is repeated until a valid CRC check is detected or all four rate hypothesis fail.

The data rate determination process of the present invention outputs one of three possible indications: a correct rate indication, an erasure indication, or an incorrect rate indication. The correct rate indication typically results in decoder 230 providing valid decoded data. An erasure indication indicates that the correct data rate cannot be determined and activates a mechanism for handling erasure frame. One method for handling erasure is to repeat the last known good decoded frame with the anticipation that the data has not changed much from frame to frame. Another method for handling erasure is to extrapolate the erasure frame from known good decoded frames on both sides of the erasure frame, thereby smoothing the erasure frame. These mechanisms designed for handling erasures can slightly degrade the quality of the communication but does not cause severe degradation. However, an incorrect rate indication by rate selector 250 typically results in erroneous decoded data, or a frame error, from decoder 230. Frame error can cause severe degradation in the performance of the communication system.

In the exemplary CDMA communication system, the design goal for frame error rate (FER) is several orders of magnitude lower than the erasure rate, as suggested by "TIA/EIA/IS-98, Recommended Minimum Performance Standards for Dual-Mode Wideband Spread Spectrum Cellular Mobile Stations". Therefore, it is much more desirable to indicate an erasure (e.g. indicate that the data frame can not be properly decoded) than to incorrectly detect (e.g. indicate that the frame was received at one rate when, in fact, it was transmitted at another rate). The exemplary embodiment of the data rate determination process described above can be modified to minimize the probability of incorrect rate detection at the expense of additional erasure indications. For example, the normalized correlation metrics can be compared against a correlation threshold. If the normalized correlation metric is below the threshold, the metric can be discarded. As a second example, the difference between the highest and the second highest normalized correlation metrics is compared against a difference threshold. If the difference falls below the threshold, both normalized correlation metrics are discarded and an erasure is indicated. In both examples, low thresholds result in lower erasure rate at the expense of higher probability of incorrect rate indication. Alternatively, high thresholds result in higher erasure rate with the benefit of a lower probability of incorrect rate indication. The use of various thresholds are within the scope of the present invention.

In the alternative embodiment of the data rate determination process, rate selector 250 can also utilizes a quality indicator to assist in making the determination of the received data rate. In this embodiment, the quality indicator can comprise a set of Yamamoto quality metrics $Y_i$ which are calculated during the Viterbi de cess in the manner described in the aforementioned U.S. Pat. No. 5,751,725 now U.S. Pat. No. 5,751,725. The Yamamoto quality metrics are confidence metrics based on the difference between the selected path through a trellis and the next closest path through the trellis. Therefore, the Yamamoto quality metrics are good indications of the degree of confidence that the decoded symbols are indeed the correct symbols. One use of the Yamamoto quality metrics in rate determination is disclosed the aforementioned U.S. Pat. No. 5,751,725 now U.S. Pat. No. 5,751,725

While the CRC check is dependent on the bits in each of the four decoded frames, the Yamamoto quality metrics are dependent on the decoding process of receiving system 200. In the exemplary embodiment, Yamamoto detector 248, as with the CRC check element 240 and correlator 234, provides four Yamamoto quality metrics $Y_i$ for each of the four possible rates : $Y_0, Y_1, Y_2,$ and $Y_3$ for the full, half, quarter, and eighth rates, respectively. Although Yamamoto detector 248 is shown as a separate element, Yamamoto detector 248 can be incorporated within decoder 230.

The alternative embodiment of the data rate determination process proceeds as described in FIG. 3. However, before indicating that the received data rate is $R_i$ as shown in block 314, rate selector 250 compares the Yamamoto quality metric $Y_i$ for that rate hypothesis against a predetermined Yamamoto threshold, at block 322, as shown by the dashed line. If the Yamamoto quality metric $Y_i$ is below the threshold, rate selector 250 outputs an indication that $R_i$ is the received data rate, at block 324. Otherwise, rate selector 250 can either output an erasure (not shown) or discard this rate hypothesis and proceed to block 316, as shown by the dashed line.

In the present invention, other indicators or metrics can also be combined with the normalized correlation metrics, the CRC bits, and the Yamamoto quality metrics, to enhance the accuracy of the data rate determination process. For example, the symbol error rate (SER) for each rate hypothesis can be calculated in the manner described in the aforementioned U.S. Pat. No. 5,751,725 now U.S. Pat. No. 5,751,725, and incorporated in the data rate determination process. The use of other metrics in combination with those described above are within the scope of the present invention.

The present invention has been described in detail in the context of a CDMA communication system which comprises four data rates: full, half, quarter, and eighth. The present invention can be applied to system comprising a plurality of rates. Furthermore, each data rate can be of any value, including the zero-th rate (e.g. no data transmission). The use of any number of data rates and any rate value are within the scope of the present invention.

The exemplary and alternative embodiments of the data rate determine process described above assumes that CRC encoding is performed on all transmitted data frames. For some communication systems, this assumption is not valid. For systems wherein CRC encoding is performed only on selected data rates, the data rate determine process can be modified to utilize: 1) the CRC check when available; 2) only the normalized correlation metrics; 3) the normalized correlation metrics and the Yamamoto quality metrics; or 4) the normalized correlation metrics and some other metrics.

The data rate determine process has been described in the context of an exemplary CDMA communication system, and in particular, the forward link transmission. On the reverse link, different convolutional encoder is utilized (e.g. rate ⅓) and symbol gating is used instead of symbol repetition. However, the demodulated soft frame symbols from the reverse link transmission is similar to that of the demodulated soft frame symbols from the forward link transmission. Therefore, the data rate determine process can be applied to the reverse link transmission and is within the scope of the present invention.

I. Derivation of the Correlation Constant

In the present invention, the normalized correlation metrics $L(\hat{x}_i, y)$ are derived assuming an additive white Gaussian noise (AWGN) channel and a known received power. With these assumptions, the constant $\text{const}(R_i)$ for the forward link can be calculated as:

$$const(R_i) = \frac{N}{2\sqrt{2^i}}\left(A_s + \frac{2}{A_s}R\log_{10}2\right),\qquad(6)$$

and $$A_s = \sqrt{2 \cdot R \cdot E_b/N_t},\qquad(7)$$

where R is the code rate (e.g. rate ½ or rate ¾) associated with a full rate frame ($R_{rx}=1$) being decoded by decoder 230, $E_b/N_t$ is the energy-per-bit-to-noise ratio of the received signal, i=0, 1, 2, and 3 for full, half, quarter, and eighth rates, respectively, N is the encoded sequence length after symbol repetition and puncturing (e.g. length of the data frame), and $A_s$ is the amplitude of the transmitted symbol (assuming full rate i=0).

Equation 7 assumes the received $E_b/N_t$ is known apriori before the rate determination by rate selector 250. Thus, $A_s$ may not be accurately ascertained if $E_b/N_t$ is not known. In particular, $A_s$ can vary by a large amount (e.g. 10 dB) during fading condition. However, in the present invention, the difference between the four constants const($R_i$) changes little over a wide range of $E_b/N_t$. Thus, the present invention performs well even when the $E_b/N_t$, and thus the $A_s$, of the received signal is not known apriori. All that is required is an initial estimate of the received $E_b/N_t$.

Equation 6 was derived with the assumption that all four data rates are transmitted with equal probabilities (e.g. probability of 0.25 for each of the four data rates). In the exemplary CDMA communication system, not all data rates are transmitted with equal probabilities. In fact, the probability of transmission at the full and eighth rates can approach 0.90. Furthermore, equation 6 was derived with the assumption that the probability of a data sequence for a given rate i is equal to $2^{-NR/2^i}$. Equation 6 can be further modified to take into account data frames containing overhead bits (e.g. CRC and code tail bits) and thus use the actual probabilities for a data sequence for each of the four data rates.

As stated above, some systems do not provide CRC encoding on all data rates. For these systems, the constants can be adjusted to take into account the lack of a CRC check. For example, the constant can be increased to require a higher level of confidence before that particular data rate is indicated as the received data rate. Different adjustments to equations 6 and 7 can be contemplated and are within scope of the present invention.

In the present invention, equations 6 and 7 are used as a guideline to determine the constants const($R_i$) which are used in the calculation of the normalized correlation metrics L($\hat{x}_i$, y) in equations 2 and 3. The constants const($R_i$) can also be derived from simulation, empirical measurements, or other methods. The use of different constants const($R_i$) derived from various methods are within the scope of the present invention.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. A receiving system for determining a data rate of a received signal in a variable rate communication system comprising:
   a decoder for receiving demodulated soft frame symbols and providing decoded frames and a normalized correlation metric;
   a rate selector connected to said decoder for receiving said normalized correlation metric, said rate selector providing an indication of said data rate of said received signal in accordance with said normalized correlation metric.

2. The receiving system of claim 1 wherein said decoder is a Viterbi decoder.

3. The receiving system of claim 1 further comprising:
   a CRC check element connected to said decoder for receiving said decoded frames and providing CRC bits; and
   wherein said rate selector is also connected to said CRC check element for receiving said CRC bits, said rate selector providing an indication of said data rate of said received signal in accordance with said soft symbol error rate and said CRC bits.

4. The receiving system of claim 3 wherein said decoder is a Viterbi decoder.

5. The receiving system of claim 1 wherein said normalized correlation metric is calculated in accordance with a soft symbol error rate.

6. A receiving system for determining a data rate of a received signal in a variable rate communication system comprising:
   a decoder for receiving demodulated soft frame symbols and providing decoded frames;
   a CRC check element connected to said decoder for receiving said decoded frames and providing CRC bits;
   a re-encoder connected to said decoder for receiving said decoded frames and providing re-encoded frames;
   a delay element for receiving said demodulated soft frame symbols and providing delayed frames;
   a correlator connected to said delay element and said re-encoder for receiving said delayed frames and said re-encoded frames, respectively, said correlator providing correlation values;
   a rate selector connected to said correlator and said CRC check element for receiving said correlator values and said CRC bits, respectively, said rate selector providing an indication of said data rate of said received signal in accordance with said correlator values and said CRC bits.

7. The receiving system of claim 6 wherein said decoder is a Viterbi decoder.

8. The receiving system of claim 7 wherein said Viterbi decoder is a rate ½ convolutional decoder.

9. The receiving system of claim 7 wherein said Viterbi decoder is a rate ¾ convolutional decoder.

10. The receiving system of claim 6 wherein said decoder is a Viterbi decoder having a code rate, said code rate obtained by puncturing.

11. The receiving system of claim 6 wherein said decoder is a Viterbi decoder having a code rate, said code rate obtained by symbol repetition.

12. The receiving system of claim 6 wherein said decoder is a Viterbi decoder having a code rate, said code rate obtained by symbol gating.

13. The receiving system of claim 6 wherein said decoder is a Viterbi decoder having a code rate, said code rate obtained by puncturing and symbol repetition.

14. The receiving system of claim 6 wherein said decoder is a Viterbi decoder having a code rate which conforms to IS-95 standard.

15. The receiving system of claim 6 wherein said CRC check element conforms to IS-95 standard.

16. The receiving system of claim 7 further comprising
a Yamamoto detector connected to said decoder for receiving said decoded frames, said Yamamoto detector also connected to said rate selector for providing Yamamoto quality metrics; and
wherein said rate selector provides an indication of said data rate of said received signal in accordance with said correlator values, said CRC bits, and said Yamamoto quality metrics.

17. A method for determining a data rate of a received signal in a variable rate communication system comprising the steps of:
decoding demodulated soft frame symbols to provide decoded frames and soft symbol error rate;
computing normalized correlation metrics; and
indicating said data rate of said received signal based on said normalized correlation metrics.

18. The method of claim 17 further comprising the step of:
indicating an erasure based on said normalized correlation metrics.

19. The method of claim 18 wherein said decoding step is a convolutional decoding step performed with a Viterbi decoder.

20. The method of claim 18 further comprising the steps of:
CRC checking said decoded frames to provide CRC bits; and
wherein said indicating steps are further based on said CRC bits.

21. The method of claim 20 wherein said decoding step is a convolutional decoding step performed with a Viterbi decoder.

22. The method of claim 17 wherein the normalized correlation metrics is computed in accordance with said soft symbol error rate.

23. A method for determining a data rate of a received signal in a variable rate communication system comprising the steps of:
decoding demodulated soft frame symbols to provide decoded frames;
CRC checking said decoded frames to provide CRC bits;
re-encoding said decoded frames to provide re-encoded frames;
delaying said demodulated soft frame symbols to provide delayed frames;
correlating said delayed frames and said re-encoded frames to provide correlation values;
computing normalized correlation metrics in accordance with said correlation values and a set of constants; and
indicating said data rate of said received signal based on said normalized correlation metrics and said CRC bits.

24. The method of claim 23 further comprising the step of:
indicating an erasure based on said normalized correlation metrics and said CRC bits.

25. The method of claim 24 wherein said decoding step is a convolutional decoding step performed with a Viterbi decoder.

26. The method of claim 25 wherein said convolutional decoding step is performed with a rate ½ Viterbi decoder.

27. The method of claim 24 wherein said decoding step is performed with a Viterbi decoder having a code rate, said code rate obtained by puncturing.

28. The method of claim 24 wherein said decoding step is performed with a Viterbi decoder having a code rate, said code rate obtained by symbol repetition.

29. The method of claim 24 wherein said decoding step is performed with a Viterbi decoder having a code rate, said code rate obtained by symbol gating.

30. The method of claim 24 wherein said decoding step is performed with a Viterbi decoder having a code rate, said code rate obtained by puncturing and symbol repetition.

31. The method of claim 24 wherein said decoding step is performed with a Viterbi decoder having a code rate which conforms to IS-95 standard.

32. The method of claim 24 wherein said CRC checking step is performed in accordance with IS-95 standard.

33. The method of claim 24 further comprising the step of:
selecting a highest normalized correlation metric; and
wherein said indicating said data rate step is based on said highest normalized correlation metrics and said CRC bit corresponding to said highest normalized correlation metric.

34. The method of claim 33 further comprising the step of:
comparing said highest normalized correlation metric against a correlation threshold; and
wherein said indicating said data rate step is further based on a result of said comparing step.

35. The method of claim 24 further comprising the steps of:
computing a difference of a highest normalized correlation metric and a next highest normalized correlation metric to provide a difference;
comparing said difference against a difference threshold; and
wherein said indicating said data rate step is further based on a result of said comparing step.

36. The method of claim 24 further comprising the step of:
computing Yamamoto quality metrics based on said decoding step; and
wherein said indicating steps are further based on said Yamamoto quality metrics.

37. The method of claim 36 further comprising the step of:
comparing said Yamamoto quality metrics against a Yamamoto threshold; and
wherein said indicating steps are further based on a result of said comparing step.

38. The method of claim 24 wherein said set of constants are derived from theoretical calculation.

39. The method of claim 24 wherein said set of constants are derived from simulation.

40. The method of claim 24 wherein said set of constants are derived from empirical measurements.

41. The method of claim 24 wherein said set of constants are adjusted for data rates which do not provide CRC encoding.

\* \* \* \* \*